(12) United States Patent
Lee

(10) Patent No.: US 9,484,912 B2
(45) Date of Patent: Nov. 1, 2016

(54) RESISTANCE ELEMENT GENERATOR AND OUTPUT DRIVER USING THE SAME

(71) Applicant: SK hynix Inc., Gyeonggi-do (KR)

(72) Inventor: Sung-Jin Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/606,790

(22) Filed: Jan. 27, 2015

(65) Prior Publication Data

US 2016/0099706 A1 Apr. 7, 2016

(30) Foreign Application Priority Data

Oct. 6, 2014 (KR) ........................ 10-2014-0134143

(51) Int. Cl.
*H03B 1/00* (2006.01)
*H03K 17/687* (2006.01)

(52) U.S. Cl.
CPC .................................. *H03K 17/687* (2013.01)

(58) Field of Classification Search
USPC ........ 327/108–112, 379, 389, 391, 530–546; 323/312–317; 326/22–27, 81–87
See application file for complete search history.

(56) References Cited

U.S. PATENT DOCUMENTS

| | | | | |
|---|---|---|---|---|
| 5,760,640 A * | 6/1998 | Girard | ............... | H03L 7/0896 327/530 |
| 6,356,141 B1 * | 3/2002 | Yamauchi | ............... | G05F 3/262 323/312 |
| 6,853,253 B2 * | 2/2005 | Desortiaux | ........... | H03L 7/0896 327/157 |
| 7,635,990 B1 * | 12/2009 | Ren | ................. | H03K 19/00369 326/30 |
| 7,898,295 B1 * | 3/2011 | Kasturirangan | ..... | H03K 17/165 326/30 |
| 8,222,954 B1 * | 7/2012 | Ren | ................. | H03K 19/00369 323/312 |
| 8,502,576 B2 * | 8/2013 | Hsieh | ..................... | H02M 3/07 327/148 |
| 2002/0131519 A1 * | 9/2002 | Bu | ........................ | H04L 25/028 375/295 |
| 2003/0193350 A1 * | 10/2003 | Chow | ............. | H03K 19/018585 326/83 |
| 2005/0195003 A1 * | 9/2005 | Soe | ....................... | H03L 7/0896 327/157 |
| 2006/0066352 A1 * | 3/2006 | Davis | ............... | H03K 17/08142 326/86 |
| 2008/0218277 A1 * | 9/2008 | Tan | ...................... | H03L 7/0898 331/17 |

* cited by examiner

*Primary Examiner* — Brandon S Cole
(74) *Attorney, Agent, or Firm* — IP & T Group LLP

(57) ABSTRACT

A resistance element generator includes a reference current generation unit suitable for receiving a source reference current to generate first and second reference currents, a first resistance generation unit suitable for generating a first resistance value by using a first reference voltage and the first reference current, and outputting a first voltage corresponding to the formed first resistance value, and a second resistance generation unit suitable for generating a second resistance value by using a third reference voltage and the second reference current, and outputting a second voltage corresponding to the formed second resistance value.

18 Claims, 3 Drawing Sheets

RESISTANCE ELEMENT GENERATOR AND OUTPUT DRIVER USING THE SAME

CROSS-REFERENCE TO RELATED APPLICATIONS

The present application claims priority of Korean Patent Application No. 10-2014-0134143, filed on Oct. 6, 2014, which is incorporated herein by reference in its entirety.

BACKGROUND

1. Field

Exemplary embodiments of the present invention relate to a resistance element generator and an output driver using the same.

2. Description of the Related Art

Currently, a large number of data transmission systems require a new interface technology. In order to meet this need, low voltage differential signaling (LVDS), reduced swing differential signaling (RSDS), and scalable low voltage signaling (SLVS) have emerged as new interface technologies for transmitting data at high speeds. Such new interface technologies have high bit rates, low power consumption, and improved noise characteristics.

When transmitting and receiving data between chips, it is important to match output impedance and transmission line impedance.

When the above-described SLVS is used as one of the Interface technologies, accurate output impedance is required because SLVS is a voltage-based method. Thus, the output impedance needs to be corrected.

Conventional output impedance correction methods include forming a resistor inside the chip or mounting a resistor outside of the chip.

Mounting a resistor outside the chip requires mounting a surface mount device (SMD)-type resistor on the outside of the chip. However, this method has a disadvantage in that an element is added on the printed circuit board (PCB). Thus, the fabrication costs and utilized circuit area are increased.

In contrast, for forming a resistor in a chip, a passive element is used.

FIG. 1 is a diagram illustrating a conventional SLVS output driver. FIG. 1 shows a method for correcting impedance based on a digital code. In forming a resistor within the chip, an external controller provides a control signal for correcting impedance by using the digital code. The conventional SLVS output driver includes a plurality of resistance forming units (referred to as legs). Each of the resistance forming units (i.e., leg) 10 includes a resistor (i.e., a passive element) R and an N-channel metal oxide silicon field effect transistor (MOSFET) NM that serves as a switch. In FIG. 1, 'INP<N:1>' denotes a first impedance correction code, and 'INN<N:1>' denotes a second impedance correction code. The digital code includes the first impedance correction code and the second impedance correction code. Furthermore, 'Vtx' denotes a driving voltage source for an output driver, and 'OUTP' and 'OUTN' denote differential output terminals.

The resistor R in the chip may have a large deviation in its resistance depending on its fabrication process. Thus, after the deviation is measured during a wafer test, trimming must be performed. The trimming increases the cost and requires a fuse or one-time programmable (OTP) memory, which increases the utilized circuit area.

SUMMARY

Various embodiments of the present invention are directed to a resistance element generator which may generate a resistance element (i.e., a fixed resistance value) by using a reference voltage and a reference current without a resistor (i.e., a passive element).

In an embodiment of the present invention, a resistance element generator may include: a reference current generation unit suitable for receiving a source reference current to generate first and second reference currents; a first resistance generation unit suitable for generating a first resistance value by using a first reference voltage and the first reference current, and outputting a first voltage corresponding to the first resistance value; and a second resistance generation unit suitable for generating a second resistance value by using a third reference voltage and the second reference current, and outputting a second voltage corresponding to the second resistance value.

The first resistance value may correspond to the first reference voltage divided by the first reference current.

The second resistance generation unit may further receive a second reference voltage.

The second resistance value may correspond to the third reference voltage divided by the second reference current.

The first and second resistance values are generated through a transistor acting as an active resistor.

The transistor includes a metal oxide silicon field effect transistor (MOSFET).

In an embodiment of the present invention, an output driver may include: a resistance element generator suitable for outputting a first voltage corresponding to a first resistance value and a second voltage corresponding to a second resistance value; first and third resistance forming units suitable for receiving the first voltage and forming first differential resistors, while operating in a differential manner; and second and fourth resistance forming units suitable for receiving the second voltage and forming second differential resistors, while operating in a differential manner.

The first and third resistance forming units may share a transistor which receives the first voltage and operates as an active resistor.

The second and fourth resistance forming units may share a transistor which receives the second voltage and operates as an active resistor.

The first and third resistance forming units may include a pull-down circuit, and the second and fourth resistance forming units include a pull-up circuit.

The resistance element generator may include: a reference current generation unit suitable for receiving a source reference current to generate first and second reference currents; a first resistance generation unit suitable for generating the first resistance value by using a first reference voltage and the first reference current, and outputting the first voltage corresponding to the first resistance value; and a second resistance generation unit suitable for generating the second resistance value by using a third reference voltage and the second reference current, and outputting the second voltage corresponding to the formed second resistance value.

The first resistance value may correspond to the first reference voltage divided by the first reference current, and applies the first voltage to the first and third resistance forming units.

The second resistance value may correspond to the third reference voltage divided by the second reference current, and applies the second voltage to the second and fourth resistance forming units.

The first and second resistance values may be generated through a transistor acting as an active resistor.

The first resistance generation unit may include a replica of the first and third resistance forming units, and the second resistance generation unit includes a replica of the second and fourth resistance forming units.

In an embodiment of the present invention, an output driver may include: a resistance element generator suitable for outputting a first voltage corresponding to a first resistance value and a second voltage corresponding to a second resistance value; a plurality of pull-down differential leg pairs suitable for receiving a pull-down code; and a plurality of pull-up differential leg pairs suitable for receiving a pull-up code. Here, each leg of the pull-down differential leg pairs and the pull-up differential leg pairs may include: a first transistor suitable for operating as an active resistor and receiving a corresponding voltage among the first and second voltages; and a second transistor suitable for operating as a switch and receiving a corresponding bit of the pull-down code or the pull-up code.

The resistance element generator may include: a reference current generation unit suitable for receiving a source reference current to generate first and second reference currents; a first resistance generation unit suitable for generating the first resistance value by using a first reference voltage and the first reference current, and outputting the first voltage corresponding to the first resistance value; and a second resistance generation unit suitable for generating the second resistance value by using a third reference voltage and the second reference current, and outputting the second voltage corresponding to the formed second resistance value.

The first and second resistance values may be generated through a transistor used as an active resistor.

The first resistance generation unit may include a replica of each of the differential pull-down leg, and the second resistance generation unit includes a replica of each of the differential pull-down legs.

One first transistor may be shared by one differential leg pair of the pull-down differential leg pairs and the pull-up differential leg pairs.

DETAILED DESCRIPTION

While the present invention is described, detailed descriptions related to publicly known functions or configurations will be left out to avoid unnecessarily obscuring the subject matter of the present invention. Hereafter, various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

When an element is referred to as being "connected or coupled" to another element, it should be understood that the former can be "directly connected or coupled" to the latter, or "electrically connected or coupled" to the latter via an intervening element therebetween. Furthermore, when it is described that one "comprises" (or "includes" or "has") some elements, it should be understood that it may comprise (or include or has) only those elements, or it may comprise (or include or have) other elements as well as those elements, if there is no specific limitation. The terms of a singular form may include plural forms unless otherwise specifically stated.

A resistance element generator in accordance with an embodiment of the present invention may generate resistance elements (i.e., a fixed resistance value) by using a reference voltage and a reference current.

In other words, the resistance element generator in accordance with the embodiment of the present invention may receive a reference voltage and a reference current to generate 'analog voltage signals (i.e., first and second voltages) for forming a desired resistance value in a predetermined path'. The path (leg) may include a MOSFET receiving one of the analog voltage signals. The output driver may include a plurality of paths (legs), and by selectively enabling the paths, an output impedance for the output driver may be corrected without an internal reference resistor or external resistor.

The resistance element generator in accordance with the embodiment of the present invention may be used for matching an output impedance of an interface circuit. That is, the resistance element generator may be used in various types of output drivers whose output resistance needs to be fixed.

Figure 1:
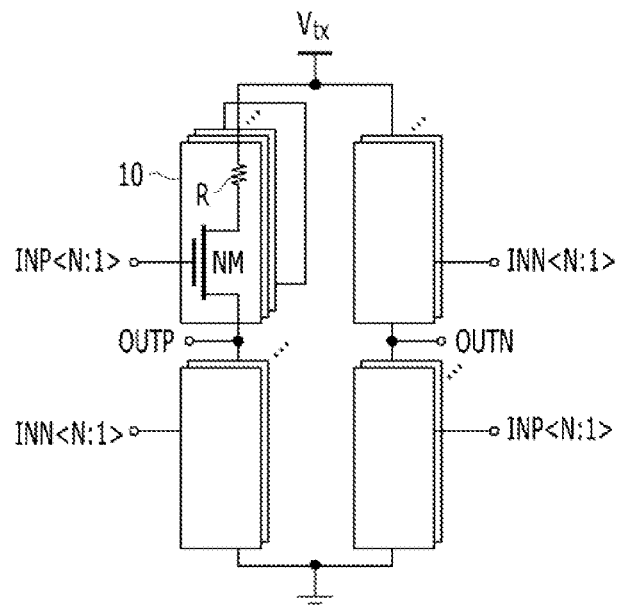
FIG. 1 is a diagram illustrating a conventional SLVS output driver.
Figure 2:
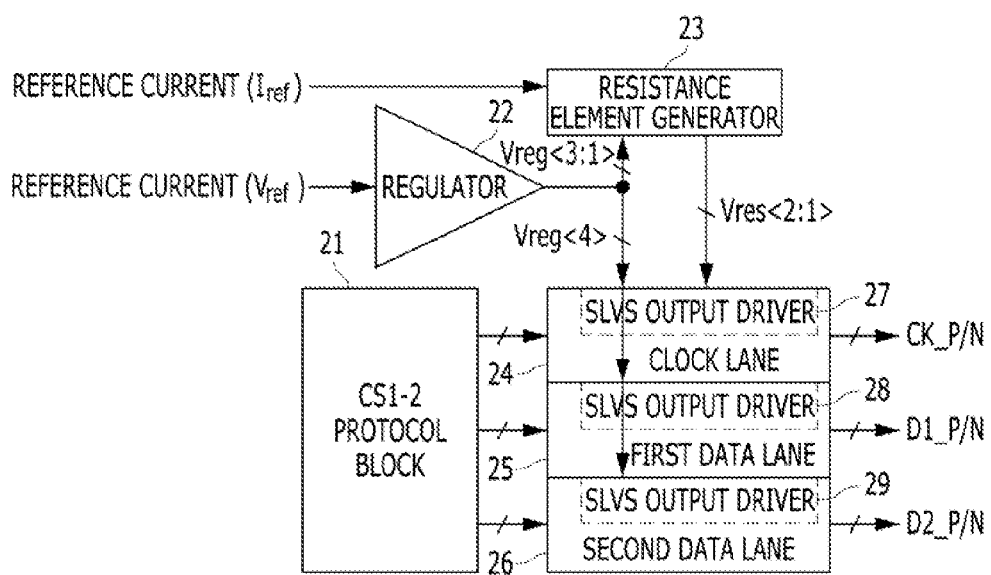
FIG. 2 is a block diagram illustrating a transmitter for a camera serial interface-2 (CSI-2) according to an embodiment of the present invention.

FIG. 2 is a block diagram illustrating a transmitter for a camera serial interface-2 (CSI-2) according to an embodiment of the present invention. FIG. 2 shows a mobile industry processor interface (MIPI) transmitter.

Here, MIPI refers to a standardization organization which has been established to standardize interfaces in mobile devices.

Furthermore, MIPI CSI-2 is mainly used for a current smart phone camera interface. The MIPI CSI-2 uses CSI-2 as a protocol layer and uses D-PHY as a physical layer. Since CSI-2 and D-PHY are publicly known, detailed descriptions thereof are omitted herein.

As illustrated in FIG. 2, the CSI-2 transmitter may include a CSI-2 protocol block 21, a regulator 22, a resistance element generator 23, a clock lane 24, a first data lane 25, and a second data line 26. Here, the clock lane 24, the first data lane 25, and the second data lane 26 may include SLVS output drivers 27, 28, and 29, respectively.

The CSI-2 protocol block 21 is a CSI-2 protocol layer which is mainly used for a current smart phone camera interface. Since the CSI-2 protocol layer is publicly known, detailed descriptions thereof are omitted herein.

The regulator 22 may receive a source reference voltage Vref generated by a reference current generation circuit (not illustrated), and regulate the reference voltage Vref to output first to fourth reference voltages Vreg<4:1>. Here, the fourth reference voltage Vreg4 may be applied to the respective output drivers 27 to 29 corresponding to the clock lane 24, the first data lane 25, and the second data lane 26, and the first to third reference voltages Vreg<3:1> may be applied to the resistance element generator 23. The first reference voltage Vreg1 may be set to 100 mV, the second reference voltage Vreg2 may be set to 300 mV, and the third reference voltage Vreg3 may be set to 400 mV, for example.

The resistance element generator 23 may receive a source reference current Iref, which is generated by a reference current generation circuit (not illustrated), and the first to third reference voltages Vreg1 to Vreg3, generate 'analog voltage signals Vres1 and Vres2 for forming a desired resistance value in a predetermined path', and apply the analog voltage signals Vres1 and Vres2 to the SLVS output drivers 27 to 29. Hereafter, the analog voltage signals Vres1 and Vres2 will be referred to as first and second voltages. Furthermore, the clock lane 24 and the first and second data lanes 25 and 26 may serve as paths for transmitting a clock CK_P/N and data D1_P/N and D2_P/N. Since the clock lane 24 and the first and second data lanes 25 and 26 are publicly known, detailed descriptions thereof are omitted herein.

Figure 3A:
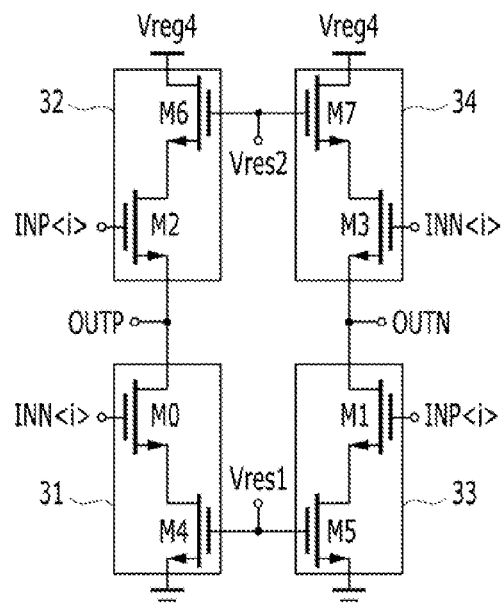
FIG. 3A is a diagram illustrating an SLVS output driver in accordance with an embodiment of the present invention.
Figure 3B:
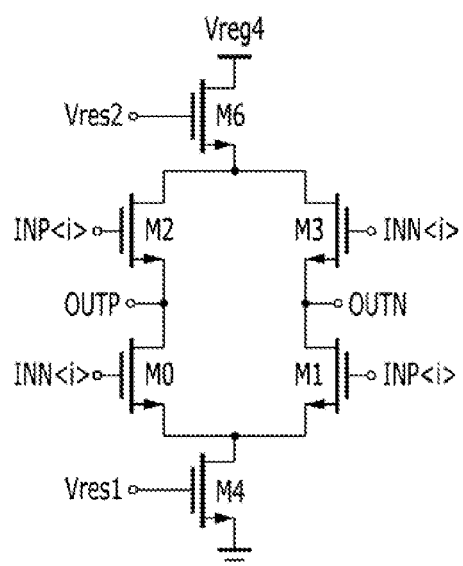
FIG. 3B is a diagram illustrating an SLVS output driver in accordance with an embodiment of the present invention.

The SLVS output drivers 27 to 29 may receive the first and second voltages Vres1 and Vref2 generated by the resistance element generator 23, and form a resistor to match the output impedance. FIGS. 3A and 3B are diagrams of an SLVS output driver in accordance with an embodiment of the present invention. The SLVS output driver of FIGS. 3A and 3B may be one of the SLVS output drivers 27 to 29 shown in FIG. 2.

As illustrated in FIG. 3A, the SLVS output driver may include first and third resistance forming units (i.e., a pull-down differential leg pair) 31 and 33 and second and fourth resistance forming units (i.e., a pull-up differential leg pair) 32 and 34. The first and third resistance forming units 31 and 33 may receive the first voltage Vres1 generated by the resistance element generator 23 and form a resistor to match output impedance, while operating in a differential manner. The second and fourth resistance forming units 32 and 34 may receive the second voltage Vres2 generated by the resistance element generator 23, and form a resistor to match output impedance, while operating in a differential manner.

The first and second voltages Vres1 and Vres2 are analog voltage signals for forming a desired resistance value. The first and second voltages Vres1 and Vres2 may be generated and applied by the resistance element generator 23. Furthermore, each of transistors M0 to M7 may be implemented with MOSFETs.

The first resistance forming unit 31 may be implemented with a pull-down circuit, for example, and include the transistor M0 configured to operate as a switch and the transistor M4 configured to receive the first voltage Vres1 generated by the resistance element generator 23 to form an active resistor.

The third resistance forming unit 33 may be implemented with a pull-down circuit, for example, and include the transistor M1 configured to operate as a switch and the transistor M5 configured to receive the first voltage Vres1 generated by the resistance element generator 23 to form an active resistor.

The second resistance forming unit 32 may be implemented with a pull-up circuit, for example, and include the transistor M2 configured to operate as a switch and the transistor M6 configured to receive the second voltage Vres2 generated by the resistance element generator 23 to form an active resistor.

The fourth resistance forming unit 34 may be implemented with a pull-up circuit, for example, and include the transistor M3 configured to operate as a switch and the transistor M7 configured to receive the second voltage Vres2 generated by the resistance element generator 23 to form an active resistor.

Each of the first to fourth resistance forming units 31 to 34 may form a desired resistance value of 50Ω or the like, for example, and use the resistance value to match output impedance.

The first and third resistance forming units 31 and 33 may form a differential pair, and the second and fourth resistance forming units 32 and 34 may form a differential pair, thereby implementing a differential signal output driver.

The first and third resistance forming units 31 and 33 may form a differential pair to operate in a differential manner. Thus, in the first and third resistance forming units 31 and 33, only one of the transistors M4 and M5 which receive the first voltage Vres1 to form an active resistor may be operated according to a differential method. Thus, as illustrated in FIG. 3B, the first and third resistance forming units 31 and 33 may be implemented to share the transistor M4.

Furthermore, the second and fourth resistance forming units 32 and 34 may also form a differential pair to operate in a differential manner. Thus, in the second and fourth resistance forming units 32 and 34, only one of the transistors M6 and M7 which receive the second voltage Vres2 to form an active resistor may be operated in a differential method. Thus, as illustrated in FIG. 3B, the second and fourth resistance forming units 32 and 34 may be implemented to share the transistor M6.

In FIG. 3A, 'INP<i>' may denote any bit of a first impedance correction code, and 'INN<i>' may denote any bit of a second impedance correction code.

In the embodiment of FIG. 3B, as two resistance forming units are implemented to share one transistor, chip area and power consumption may be reduced. Furthermore, ripple of a node between the transistor operating as a switch and the transistor forming an active resistor may be reduced. The SLVS output driver shown in FIG. 3B has the same equivalent circuit as the SLVS output driver shown in FIG. 3A.

In addition, the SLVS output driver in accordance with an embodiment of the present invention may have a plurality of first to fourth resistance forming units (i.e., legs) shown in FIGS. 3A and 3B, respectively. Here, each of the first to fourth resistance forming units may receive a corresponding bit of the first impedance correction code or the second impedance correction code.

Figure 4:
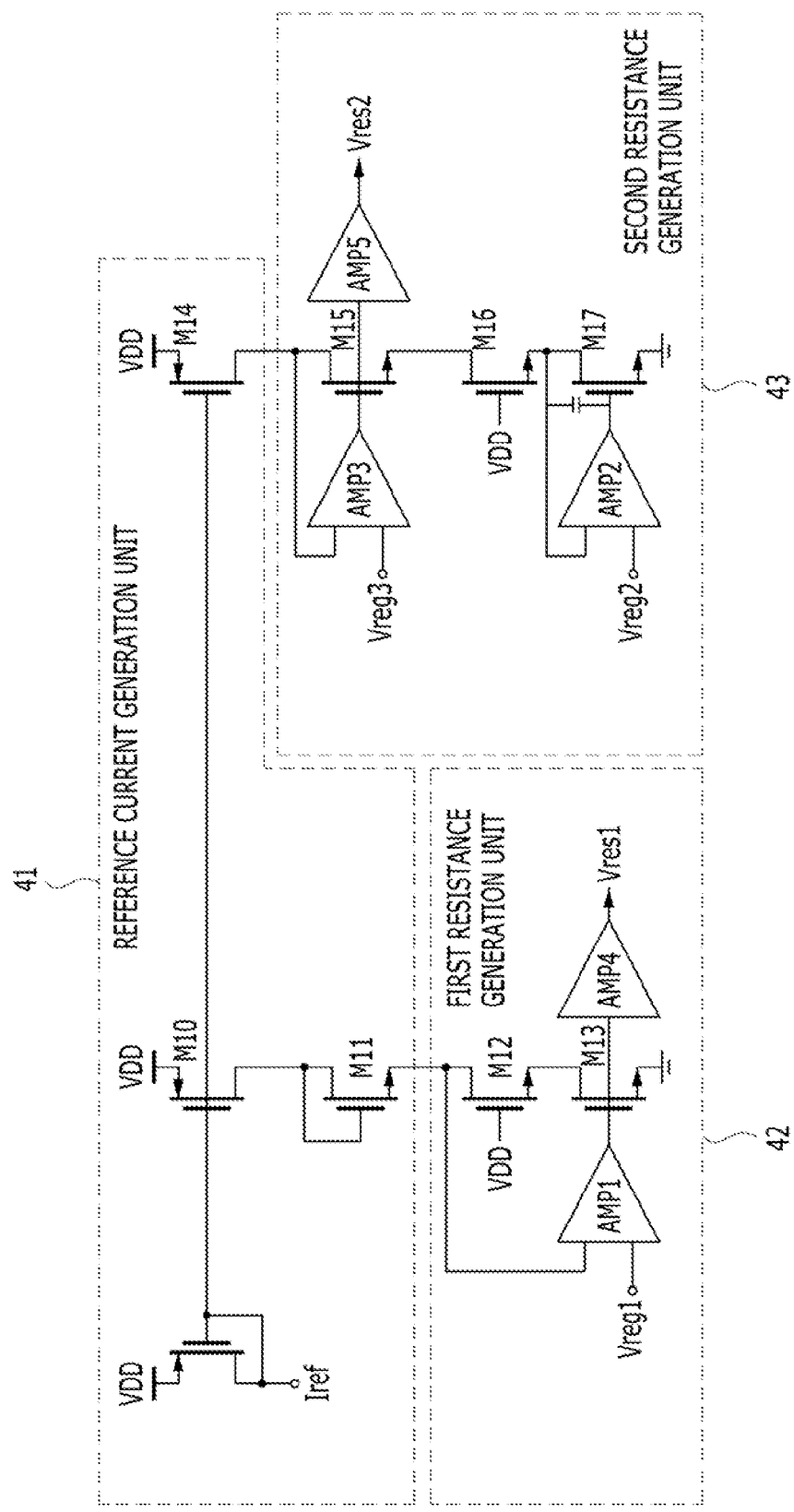
FIG. 4 is a diagram illustrating a resistance element generator in accordance with an embodiment of the present invention.

FIG. 4 is a diagram illustrating a resistance element generator in accordance with an embodiment of the present invention. The resistance element generator of FIG. 4 may form the resistance element generator 23 shown in FIG. 2.

As illustrated in FIG. 4, the resistance element generator may include a reference current generation unit 41, a first resistance generation unit 42, and a second resistance generation unit 42. The reference current generation unit 41 may receive a source reference current Iref and form first and second reference currents. The first resistance generation unit 42 may receive the first reference voltage, receive the first reference current from the reference current generation unit 41, form a first resistance value using the first reference voltage and the first reference current, and output the first voltage Vres1 corresponding to the formed first resistance value. The second resistance generation unit 43 may receive the second and third reference voltages, receive the second reference current from the reference current generation unit 41, form a second resistance value using the second and third reference voltages and the second reference current, and output the second voltage Vres2 corresponding to the formed second resistance value.

The first resistance generation unit 42 may be matched as a replica with the first and third resistance generation units 31 and 33 in the SLVS output driver of FIG. 3A. Furthermore, the second resistance generation unit 43 may be matched as a replica with the second and fourth resistance generation units 32 and 34 in the SLVS output driver of FIG. 3A. Furthermore, the first and second resistance generation units 42 and 43 may have a replica configuration with the SLVS output driver of FIG. 3B.

Furthermore, each of transistors M10 to M17 may be implemented with MOSFETs.

The reference current generation unit 41 may receive a source reference current Iref generated by a reference current generation circuit (not illustrated), form first and second reference currents, and apply the first and second reference currents to the first and second resistance generation units 42 and 43. The values of the first and second reference currents may be determined according to the MOSFET ratio of the first to fourth resistance forming units 31 to 34 to the first and second resistance generation units 42 and 43, a voltage value of the SLVS output driver, an output impedance value to be generated, and a termination resistance value of a receiver. The reference current generation unit 41 may be implemented with a plurality of transistors M10, M11, and M14 using a publicly known technology. Thus, the detailed descriptions thereof are omitted herein.

Furthermore, the first resistance generation unit 42 may receive the first reference voltage (for example, 100 mV) applied from the regulator 22 shown in FIG. 2, receive the first reference current from the reference current generation unit 41, form a first resistance value corresponding to 'the first reference voltage/the first reference current' according to the Ohm's law, and apply the first voltage Vres1 corresponding to the first resistance value to the SLVS output driver shown in FIG. 3A or 3B. Then, the first voltage Vres1 may be used as a voltage for forming a desired resistance value in the path of the SLVS output driver.

Furthermore, the second resistance generation unit 43 may receive the second and third reference voltages (for example, 300 mV and 400 mV) applied from the regulator 22 shown in FIG. 2, receive the second reference current from the reference current generation unit 41, form a second resistance value corresponding to 'the third reference voltage−the second reference voltage/the second reference current' according to the Ohm's law, and apply the second voltage Vres2 corresponding to the second resistance value to the SLVS output driver shown in FIG. 3A or 3B. Then, the second voltage Vres2 may be used as a voltage for forming a desired resistance value in the path of the SLVS output driver.

The values of the first to third reference voltages may be calculated and determined through a supply voltage value and an output impedance value of the SLVS output driver and a termination resistance value of the receiver, for example. In the embodiment of the present invention, the first reference voltage of 100 mV may be applied to the first reference generation unit 42 and the second and third reference voltages of 300 mV and 400 mV may be applied to the second resistance generation unit 43, according to the specification of the SLVS output driver. The values of the first to third reference values may be changed according to the specifications that are to be implemented.

Next, the operation principles of the first resistance generation unit 42 will be described. When a voltage value corresponding to 'input voltage value of first amplifier AMP1—ground voltage value' is applied across the transistor M12 operating as a replica-switch and the transistor M13 forming a replica-active resistor by the first amplifier AMP1 and the first reference current is inputted by the reference current generation unit 41, an impedance corresponding to voltage/current may be formed according to Ohm's law. The transistor M12 may receive a power source voltage VDD. The transistor M12 is a replica of the transistors M0 and M1 shown in FIG. 3A, and the transistor M13 is a replica of the transistors M4 and M5 shown in FIG. 3A. Furthermore, when the output of the first amplifier AMP1 receiving the first reference voltage 100 mV is applied to the transistor M13 forming a replica active resistor of the first resistance generation unit 42, the above-described impedance may be determined and formed according to the ratio. Furthermore, the output of the first amplifier AMP1 may be buffered through a fourth amplifier AMP4 to improve stability. The fourth amplifier AMP4 may apply the first voltage Vres1 to the SLVS output driver shown in FIG. 3A or 3B.

The operation principles of the second resistance generation unit 43 are substantially the same as that of the first resistance generation unit 42. First, the source of the transistor M16 may serve as one terminal of a second amplifier AMP2 due to the second amplifier AMP2 and the transistor M17, and the second amplifier AMP2 may receive the second reference voltage of 300 mV through the other terminal thereof. When a voltage value corresponding to 'input voltage value of third amplifier AMP3—input voltage value of second amplifier AMP2' is applied across the transistor M16 operating as a replica-switch and the transistor M15 forming a replica-active resistor by the second and third amplifier AMP2 and AMP3 and the second reference current is inputted by the reference current generation unit 41, an impedance corresponding to voltage/current may be formed according to the Ohm's law. The transistor M16 may receive a power source voltage VDD. The transistor M16 is a replica of the transistors M2 and M3 shown in FIG. 3A, and the transistor M15 is a replica of the transistors M6 and M7 shown in FIG. 3A. Furthermore, when the output of the third amplifier AMP3 receiving the third reference voltage of 400 mV is applied to the transistor M15 forming a replica active resistor of the second resistance generation unit 43, the above-described impedance may be determined and formed according to the ratio. Furthermore, the output of the third amplifier AMP3 may be buffered through a fifth amplifier AMP5 to improve stability. The fifth amplifier AMP5 may apply the second voltage Vres2 to the SLVS output driver shown in FIG. 3A or 3B.

The embodiments of the present invention may operate automatically when power is applied to the chip to induce voltage/current. Thus, separate digital correction circuits and correction times may not be necessary.

In accordance with the embodiments of the present invention, a resistance element (i.e., a fixed resistance value) may be generated using the reference voltage and the reference current without a resistor. Thus, an internal reference resistor or external resistor may not be required.

Furthermore, since a resistor serving as a passive element does not need to be formed, the chip area may be reduced.

Furthermore, the digital correction circuit and the correction time may be removed.

Furthermore, as one transistor is shared, the chip area and power consumption may be reduced, and ripple of a node between the transistor operating as a switch and the transistor forming an active resistor may be reduced.

Although various embodiments have been described for illustrative purposes, it will be apparent to those skilled in the art that various changes and modifications may be made without departing from the spirit and scope of the invention as defined in the following claims.

What is claimed is:

1. A resistance element generator comprising:
   a reference current generation unit suitable for receiving a source reference current to generate first and second reference currents;
   a first resistance generation unit suitable for generating a first resistance value by using a first reference voltage and the first reference current, and outputting a first voltage corresponding to the first resistance value; and
   a second resistance generation unit including a first pull-up unit suitable for generating a second resistance value by using a second reference voltage and the second reference current, and outputting a second voltage corresponding to the second resistance value and a second pull-up unit suitable for providing the first pull-up unit with a third reference voltage,
   wherein the second resistance generation unit further includes a switch transistor formed between the first pull-up unit and the second pull-up unit.

2. The resistance element generator of claim 1, wherein the first resistance value corresponds to the first reference voltage divided by the first reference current.

3. The resistance element generator of claim 1, wherein the second resistance value corresponds to the third reference voltage divided by the second reference current.

4. The resistance element generator of claim 1, wherein the first and second resistance values are generated through a transistor acting as an active resistor.

5. The resistance element generator of claim 4, wherein the transistor includes a metal oxide silicon field effect transistor (MOSFET).

6. An output driver comprising:
   a resistance element generator including a first resistance generation unit suitable for outputting a first voltage corresponding to a first resistance value and including a second resistance generation unit suitable for outputting a second voltage corresponding to a second resistance value; and
   an output driving unit, comprising:
      first and third resistance forming units suitable for receiving the first voltage and forming first differential resistors, while operating in a differential manner; and
      second and fourth resistance forming units suitable for receiving the second voltage and forming second differential resistors, while operating in a differential manner,
   wherein the first resistance generation unit includes a replica of the first and third resistance forming units, and the second resistance generation unit includes a replica of the second and fourth resistance forming units.

7. The output driver of claim 6, wherein the first and third resistance forming units share a transistor which receives the first voltage and operates as an active resistor.

8. The output driver of claim 6, wherein the second and fourth resistance forming units share a transistor which receives the second voltage and operates as an active resistor.

9. The output driver of claim 6, wherein the first and third resistance forming units include a pull-down circuit, and the second and fourth resistance forming units include a pull-up circuit.

10. The output driver of claim 6, wherein the resistance element generator comprises:
    a reference current generation unit suitable for receiving a source reference current to generate first and second reference currents;
    the first resistance generation unit suitable for generating the first resistance value by using a first reference voltage and the first reference current, and outputting the first voltage corresponding to the first resistance value; and
    the second resistance generation unit suitable for generating the second resistance value by using a second reference voltage and the second reference current, and outputting the second voltage corresponding to the formed second resistance value.

11. The output driver of claim 10, wherein the first resistance value corresponds to the first reference voltage divided by the first reference current, and applies the first voltage to the first and third resistance forming units.

12. The output driver of claim 10, wherein the second resistance value corresponds to the second reference voltage divided by the second reference current, and applies the second voltage to the second and fourth resistance forming units.

13. The output driver of claim 10, wherein the first and second resistance values are generated through a transistor acting as an active resistor.

14. An output driver comprising:
    a resistance element generator including a first resistance generation unit suitable for outputting a first voltage corresponding to a first resistance value and including a second resistance generation unit for outputting a second voltage corresponding to a second resistance value; and
    an output driving unit, comprising:
       a plurality of pull-down differential leg pairs suitable for receiving a pull-down code; and
       a plurality of pull-up differential leg pairs suitable for receiving a pull-up code,
       wherein each leg of the pull-down differential leg pairs and the pull-up differential leg pairs includes:
          a first transistor suitable for operating as an active resistor and receiving a corresponding voltage among the first and second voltages; and
          a second transistor suitable for operating as a switch and receiving a corresponding bit of the pull-down code or the pull-up code,
       wherein the first resistance generation unit includes a replica of each of the differential pull-down legs, and the second resistance generation unit includes a replica of each of the differential pull-up legs.

15. The output driver of claim 14, wherein the resistance element generator comprises:
    a reference current generation unit suitable for receiving a source reference current to generate first and second reference currents;
    the first resistance generation unit suitable for generating the first resistance value by using a first reference voltage and the first reference current, and outputting the first voltage corresponding to the first resistance value; and
    the second resistance generation unit suitable for generating the second resistance value by using a second reference voltage and the second reference current, and outputting the second voltage corresponding to the formed second resistance value.

16. The output driver of claim 15, wherein the first and second resistance values are generated through a transistor acting as an active resistor.

17. The output driver of claim 14, wherein one first transistor is shared by one differential leg pair of the pull-down differential leg pairs and the pull-up differential leg pairs.

18. The output driver of claim 14, wherein the first transistor as the active resistor included in the plurality of pull-up differential leg pairs includes a NMOS transistor.

* * * * *